(12) United States Patent
Maurer et al.

(10) Patent No.: US 10,941,035 B2
(45) Date of Patent: Mar. 9, 2021

(54) METHOD FOR PRODUCING STRUCTURED SURFACES

(71) Applicant: Leibniz-Institut für Neue Materialien gemeinnützige GmbH, Saarbrücken (DE)

(72) Inventors: Johannes H. M. Maurer, Homburg (DE); Tobias Kraus, Saarbrücken (DE); Lola González-García, Saarbrücken (DE); Beate Reiser, Kaiserslautern (DE); Ioannis Kanelidis, Saarbrücken (DE); Peter William de Oliveira, Saarbrücken (DE); Jenny Kampka, Ensdorf (DE); Karsten Moh, Blieskastel-Brenschelbach (DE)

(73) Assignee: Leibniz-Institut für Neue Materialien gemeinnützige GmbH, Saarbrücken (DE)

(*) Notice: Subject to any disclaimer, the term of this patent is extended or adjusted under 35 U.S.C. 154(b) by 0 days.

(21) Appl. No.: 15/753,182

(22) PCT Filed: Sep. 2, 2016

(86) PCT No.: PCT/EP2016/070686
§ 371 (c)(1),
(2) Date: Feb. 16, 2018

(87) PCT Pub. No.: WO2017/042094
PCT Pub. Date: Mar. 16, 2017

(65) Prior Publication Data
US 2018/0251370 A1    Sep. 6, 2018

(30) Foreign Application Priority Data
Sep. 7, 2015   (DE) .................. 10 2015 115 004

(51) Int. Cl.
*B05D 5/12*         (2006.01)
*B81C 1/00*         (2006.01)
(Continued)

(52) U.S. Cl.
CPC ........ *B81C 1/0046* (2013.01); *G02F 1/13439* (2013.01); *G03F 7/0002* (2013.01);
(Continued)

(58) Field of Classification Search
USPC ........................................... 427/122
See application file for complete search history.

(56) References Cited

U.S. PATENT DOCUMENTS 4,721,632 A * 1/1988 Brown ............... C03C 17/3452
427/108
10,580,549 B2  3/2020 Alden et al.
(Continued)

FOREIGN PATENT DOCUMENTS

CN       102311681       *  1/2012
CN       102311681 A        1/2012
(Continued)

OTHER PUBLICATIONS

Feng et al., "Simple and rapid synthesis of ultrathin gold nanowires, their self-assembly and application in surface-enhanced Raman scattering", Chem. Commun., 2009, 1984-1986.
(Continued)

*Primary Examiner* — Brian K Talbot
(74) *Attorney, Agent, or Firm* — Cahn & Samuels, LLP

(57) ABSTRACT

A process for producing a structured surface, in which a composition comprising nanowires is applied to a surface and structured, especially by partial displacement of the
(Continued)

composition. When the solvent is removed, the nanowires aggregate to form structures. These may be transparent and also conductive.

13 Claims, 18 Drawing Sheets

(51) Int. Cl.

| | |
|---|---|
| G02F 1/1343 | (2006.01) |
| G03F 7/00 | (2006.01) |
| H01L 51/00 | (2006.01) |
| H01L 51/44 | (2006.01) |
| H01L 31/0224 | (2006.01) |
| G06F 3/041 | (2006.01) |
| H01L 31/0216 | (2014.01) |
| H01Q 1/22 | (2006.01) |
| G02F 1/1333 | (2006.01) |
| C23C 18/12 | (2006.01) |
| B05D 3/12 | (2006.01) |
| B05D 1/32 | (2006.01) |
| H05K 3/04 | (2006.01) |
| H05K 3/14 | (2006.01) |
| H05K 3/12 | (2006.01) |
| H05K 1/09 | (2006.01) |

(52) U.S. Cl.
CPC ........ *G06F 3/041* (2013.01); *H01L 31/02167* (2013.01); *H01L 31/022466* (2013.01); *H01L 51/0022* (2013.01); *H01L 51/442* (2013.01); *H01Q 1/2208* (2013.01); *B05D 1/32* (2013.01); *B05D 3/12* (2013.01); *B05D 5/12* (2013.01); *B81B 2203/04* (2013.01); *C23C 18/1262* (2013.01); *G02F 1/13338* (2013.01); *G02F 2202/36* (2013.01); *G06F 2203/04103* (2013.01); *G06F 2203/04112* (2013.01); *H05K 1/09* (2013.01); *H05K 3/048* (2013.01); *H05K 3/1208* (2013.01); *H05K 3/1225* (2013.01); *H05K 3/143* (2013.01); *Y02E 10/549* (2013.01); *Y02P 70/50* (2015.11)

(56) References Cited

U.S. PATENT DOCUMENTS

| | | | |
|---|---|---|---|
| 2009/0061194 A1* | 3/2009 | Green | B82Y 10/00 428/220 |
| 2010/0078070 A1 | 4/2010 | Hoyosa et al. | |
| 2011/0095275 A1* | 4/2011 | Li | H01L 51/442 257/40 |
| 2013/0040516 A1 | 2/2013 | Pruneri et al. | |
| 2013/0075632 A1* | 3/2013 | Cho | H01J 1/52 250/515.1 |
| 2013/0101796 A1 | 4/2013 | Arzt et al. | |
| 2013/0236708 A1 | 9/2013 | Moh et al. | |
| 2013/0236732 A1 | 9/2013 | de Oliveira et al. | |
| 2014/0251662 A1* | 9/2014 | Rotto | C09J 9/02 174/253 |

FOREIGN PATENT DOCUMENTS

| | | |
|---|---|---|
| DE | 102010052033 A1 | 5/2012 |
| DE | 112011100593 T5 | 1/2013 |
| EP | 1323793 * | 7/2003 ............. C09D 11/00 |
| EP | 1323793 A1 | 7/2003 |
| EP | 1947701 * | 7/2008 ......... H01L 31/0224 |
| EP | 1947701 A2 | 7/2008 |
| JP | 2009505358 A | 2/2009 |
| JP | 2012009239 A | 1/2012 |
| JP | 2013073475 A | 4/2013 |
| WO | 2007022226 A2 | 2/2007 |

OTHER PUBLICATIONS

Gonzales-Garcia et al., "Ultrathin gold nanowires for transparent electronics: breaking bafflers", Procedia Engineering 141 (2016) 152-156.
Maurer et al., "Sintering of Ultrathin Gold Nanowires for Transparent Electronics", ACS Appl. Mater. Interfaces 2015, 7, 7838-7842.
English Abstract of DE 112011100593T5, Jan. 24, 2013.
English translation of International Preliminary Report on Patentability dated Mar. 22, 2018.
English Machine translation of CN 102311681A, printed Feb. 2020.
English Abstract for JP2012009239 A, Jan. 12, 2012.
English Abstract for JP 2013073475A, dated Apr. 22, 2013.
Japanese Office Action, dated Nov. 24, 2020.

* cited by examiner a)

b)

METHOD FOR PRODUCING STRUCTURED SURFACES

This patent application is a U.S. national stage application of PCT international application PCT/EP2016/070686 filed on 2 Sep. 2016 and claims priority of German patent document 10 2015 115 004.2 filed on 7 Sep. 2015, the entireties of which are incorporated herein by reference.

FIELD OF THE INVENTION

The invention relates to a process for producing structured, especially conductive surfaces, and to structures of this kind on substrates and to the use thereof.

BACKGROUND OF THE INVENTION

Transparent conductive electrodes (TCEs) are important constituents of modern devices such as touchscreens, solar cells, etc.

Specifically in the case of transparent electrodes, the structures applied have to be particularly finely and uniformly structured.

There are known production processes based on lithography or transfer printing. These processes frequently include treatments under reduced pressure, especially in order to apply metallic layers.

US2003/0168639 A1 discloses that nanoparticles can be formed by an appropriate stamp to give structures. In order to keep the structures conductive, a high content of particles is necessary. Therefore, the structures obtained are not transparent. In order to obtain conductive structures, a thermal treatment is also necessary.

The problem addressed by the invention is that of specifying a process which enables the production of metallic structures in a simple manner, especially of conductive structures. The process is also to enable the production of transparent structures.

SUMMARY OF THE INVENTION

This problem is solved by the inventions having the features of the independent claims. Advantageous developments of the inventions are characterized in the dependent claims. The wording of all claims is hereby incorporated by reference into this description. The inventions also encompass all viable combinations, and especially all combinations mentioned, of independent and/or dependent claims.

The problem is solved by a process for producing metallic structures, wherein a composition comprising nanowires and at least one solvent is provided. This is structured on a substrate.

Thereafter, the solvent is at least partly removed. This results in increased aggregation of the nanowires on the surface corresponding to the structuring. This affords a metallic structure composed of the nanowires on the surface.

Preference is given to complete removal of the at least one solvent.

There follows a detailed description of individual process steps. The steps need not necessarily be conducted in the sequence specified, and the process to be outlined may also have further, unspecified steps.

The structuring of the composition on the surface can be accomplished in different ways. For instance, the composition can be applied only to particular regions, especially lines, or may accumulate there. This can be achieved, for example, by appropriate treatment of the surface prior to the application.

In another embodiment of the invention, the structuring is effected by contacting a structure template with the composition before or after the contacting of the composition with a surface.

In another embodiment of the invention, the structuring is effected by applying the composition into a structured mask which is applied to the surface prior to the application.

In a preferred embodiment of the invention, the composition is applied to a substrate and then a structure template is applied, with partial displacement of the composition. The partial displacement results in contact between the structure template and the surface of the substrate. This process has the advantage that the controlled displacement of the composition can achieve structuring in a simple manner. Structure templates of this kind can be produced in a simple manner.

In a likewise preferred embodiment of the invention, the composition is applied to a structure template and the structure template thus treated is applied to the surface. The composition may, for example, be in deeper structures of the structure template.

In the next step, the solvent is at least partly removed. This can be accomplished in many ways. For example by evaporating the solvent, in which case the evaporating can be supported by heating. Owing to the typically small amounts, the evaporation can also take place with the structure template applied. The strength of heating depends on the materials and solvents used. For example, there may be heating to up to 100° C.

The at least partial removal of the solvent preferably takes place with the structure template applied to the surface.

The composition comprises nanowires. In the context of the invention, this is generally understood to mean elongated bodies having an aspect ratio exceeding 100, by contrast with spherical nanoparticles or nanorods. A nanowire of this kind can be described, for example, using two parameters. Firstly the mean diameter of the wire and secondly the length of the wire. It is a particular feature of nanowires that they have a diameter below 100 nm, preferably below 50 nm, preferably below 20 nm, more preferably below 10 nm, especially below 5 nm. The length thereof is more than 300 nm, preferably more than 500 nm, more preferably more than 1 µm. The dimensions can be determined by means of TEM. The length is understood here to mean the length possessed by at least 50% by weight of the nanorods present in the composition, especially at least 60% by weight, very particularly at least 80% by weight, especially 100% by weight. The nanowires are on the longer side in TEM. The diameters determined are therefore an average of the diameters of nanowires in different orientation. It is also possible for agglomerates of nanowires to occur in the composition. The figures are always based on one nanowire.

In one embodiment of the invention, the composition comprises nanowires having a mean diameter below 15 nm, preferably below 10 nm, especially below 5 nm. The diameter may also be below 3 nm, preferably below 2 nm. Particularly preferred ranges are between 0.5 nm and 5 nm, especially 0.5 nm and 3 nm, or 0.5 nm to 2 nm.

The length of the nanowires is more than 1 µm, preferably more than 1.5 µm. Independently of this, the length may be up to 15 µm, preferably up to 10 µm. The length may, for example, be 1 µm to 15 µm, especially 2 to 15 µm.

The nanowires preferably have an aspect ratio of length to diameter of more than 500:1, especially more than 1000:1, very particularly more than 1500:1 or more than 2000:1.

Preferably, at least 50% by weight, preferably at least 80% by weight, especially 100% by weight, of the nanowires in the composition fulfill one of the above parameter specifications.

By virtue of the low diameter of the nanowires, they have high flexibility. They can therefore adapt to structures without breaking. They also have a tendency to form bundles owing to their particularly high surface area. This is promoted by their flexibility.

In the removal of the solvent, this high aspect ratio has the effect that the wires aggregate to form a small number of bundles. As a result of their flexibility, they can also follow more complicated structures of the structure template. As a result, the production of curved or crossing structures such as grids is possible without any problem. Since the nanowires aggregate in an offset manner, a continuous structure is formed. Owing to the parallel alignment, a bundle of this kind has much fewer interfaces between metallic or semimetallic phases. As a result, the conductivity along the bundle is better than in the case of a comparable arrangement of nanoparticles. A percolating network is possible. The bundles here are parallel to the surface and follow the recesses of the structure template in longitudinal direction.

The parallel alignment also makes it possible to obtain anisotropic conductivity.

The high aspect ratio promotes the aggregation of the nanowires to form bundles. The high aspect ratio also reduces the number of contact sites along a conduction pathway of a particular distance compared to spherical nanoparticles.

By virtue of the formation of bundles, the structure formed is preferably thinner than the distance defined by the recess in the structure template.

Useful methods for production of the nanowires are all of those known to the person skilled in the art. One example is the reduction of corresponding salt solutions. For methods of this kind, there are known conditions under which nanowires are obtained. One example of such a method is described in Feng et al., Simple and Rapid Synthesis of Ultrathin Gold Nanowires, their Self-assembly and Application in Surface-enhanced Raman Scattering. Chem. Commun. 2009, 1984-1986.

In one embodiment of the invention, the nanowires are inorganic nanowires. They may be metallic nanowires comprising a metal, mixtures of two or more metals or an alloy of two or more metals, e.g. FePt. The metals are preferably selected from the metals of IUPAC groups 1 to 16, and the lanthanoids, preferably from the metals of groups 4 to 16, especially Au, Ag, Cu, Pt, Pd, Ni, Ru, In, Rh, Al, Pb, Bi, Te. The nanowires may also comprise conductive or semiconductive oxides. Examples of such oxides, which may also be doped, are indium tin oxide (ITO) or antimony tin oxide (ATO). It is also possible to use semiconductors of groups II-VI, III-V or IV, or alloys of semiconductors of this kind. Examples of these are CdS, CdSe, CdTe, InP, InAs, ZnS, ZnSe, ZnTe, HgTe, GaN, GaP, GaAs, GaSb, InSb, Si, Ge, AlAs, PbSe or PbTe. They may also be nonmetallic nanowires, for example composed of oxides, sulfides, selenides of the aforementioned metals. Examples of these are $Cu_2S$, $Bi_2S_3$, $Sb_2S_3$, $SmO_3$, PbS.

The concentration of the nanowires in the composition is preferably below 30 mg/mL, especially below 15 mg/mL, preferably below 10 mg/mL. The concentration can be used to control the thickness of the structures obtained. The concentration is preferably above 0.1 mg/mL, especially above 0.5 mg/mL, or above 1 mg/mL, and within a range between the aforementioned limits.

The composition may also comprise at least one stabilizer. This is understood to mean compounds which prevent aggregation of the nanowires at the concentration of nanowires present in the composition. These are typically compounds which aggregate on the surface of the nanowires. These are frequently organic compounds having at least one functional group selected from hydroxyl groups, sulfide groups, ether groups, carboxylate groups, ester groups or amino groups. These compounds may also affect the choice of solvent. For nonpolar solvents, these may be, for example, alkylamines, alcohols, carboxylic acids, thiols with aliphatic radicals having 4 to 30 carbon atoms.

Suitable solvents are solvents known to those skilled in the art for nanowires. Preference is given to solvents having a boiling point below 150° C. They may be polar or nonpolar solvents. Examples of polar solvents are deionized $H_2O$, methanol, ethanol, isopropanol, n-propanol or butanol, ketones such as acetone, ethers such as diethyl ether, methyl tert-butyl ether, tetrahydrofuran, esters such as ethyl acetate, halogenated solvents such as dichloromethane, chloroform. Examples of nonpolar solvents are aliphatic or cycloaliphatic hydrocarbons such as n-pentane, isopentane, n-butane, n-hexane, isohexane or cyclohexane, methylcyclohexane, benzene, toluene, naphthalene.

The substrate may be any material suitable for this purpose. Examples of suitable materials are metals or metal alloys, glass, ceramic, including oxide ceramic, glass ceramic, or plastics, and also paper and other cellulosic materials. It is of course also possible to use substrates having a surface layer composed of the aforementioned materials. The surface layer may, for example, be a metalization, an enameling, a glass or ceramic layer or a paint layer.

Examples of metals or metal alloys are steel, including stainless steel, chromium, copper, titanium, tin, zinc, brass and aluminum. Examples of glass are soda-lime glass, borosilicate glass, lead crystal and silica glass. The glass may, for example, be plate glass, hollow glass such as vessel glass, or laboratory equipment glass. The ceramic may, for example, be a ceramic based on the oxides $SiO_2$, $Al_2O_3$, $ZrO_2$ or MgO, or the corresponding mixed oxides. Examples of the plastic which, like the metal too, may be present in the form of a film, are polyethylene (PET), e.g. HDPE or LDPE, polypropylene, polyisobutylene, polystyrene (PS), polyvinyl chloride (PVC), polyvinylidene chloride, polyvinyl butyral, polytetrafluoroethylene, polychlorotrifluoroethylene, polyacrylates, polymethacrylates such as polymethylmethacrylate (PMMA), polyamide, polyethylene terephthalate, polycarbonate, regenerated cellulose, cellulose nitrate, cellulose acetate, cellulose triacetate (TAC), cellulose acetate butyrate or rubber hydrochloride. A painted surface may be formed from standard basecoats or paints. In a preferred embodiment, the substrates are films, especially polyethylene terephthalate films or polyimide films.

The composition can be applied using standard methods, for example dipping, rolling, knife-coating, flow-coating, drawing, spraying, spinning or spin-coating. It is also possible for further auxiliaries such as wetting aids to be present.

For example, the applying of the composition can occur via a frame which is placed onto the substrate and the composition can be introduced into the space bounded by the frame which is then formed. The frame may consist of an elastic material. The frame may have any desired shapes.

In a further step of a preferred embodiment of the invention, a structure template is applied to the composition applied with partial displacement of the composition. The structure template is a template of any shape, which displaces the composition at these points by coming into contact with the surface of the substrate. It is necessary here for the composition on the surface of the substrate to be sufficiently viscous or fluid here that displacement is possible.

The structure template may, for example, be a stamp. The structure template may be formed from any desired materials. Possible materials for the structure template are known to the person skilled in the art from the field of microstructure stamps. They can also be obtained, for example, by lithographic methods. Examples are metals such as nickel, semimetals such as silicon, or photoresists. It is also possible to use silicones such as PDMS (polydimethylsiloxane).

The structure template preferably has recesses and projections which correspond to lines or a grid. The individual projections may have square, rectangular, round and/or oval footprints. They are preferably arranged in a regular manner, such that the recesses in between lead to formation of a grid structure.

The minimum width of the depressions in the structure template is preferably below 2 µm.

It may be necessary to treat the surface of the structure template, for example by treatment with fluorinated silanes.

The surface of the structure template may also be modified by other treatments, such as plasma treatment. This allows the structure template to be matched to the composition.

It may be necessary to match the design of the structure template to the thickness of the layer of the composition, for example in order to provide sufficient space for the displaced precursor compound and any trapped air. This can likewise be affected by the thickness of the structure template, or by the depth of the depressions present on the surface thereof.

With respect to the area with which it comes into contact, the structure template is a negative of the structure desired.

It is also possible that the composition is first applied to the structure template and the two are applied to the substrate together.

After the at least partial removal of the solvent, the structure template is preferably removed.

In a further embodiment of the invention, the substrate is subjected to further treatment after formation of the structure and any removal of the solvent. The coated substrate can be dried, for example by heating in an oven, by compressed air and/or by drying at room temperature.

It is also possible to apply further layers, for example for protection of the coated surface from oxidation and water or from UV radiation.

In a preferred embodiment, after the structuring, especially after removal of the structure template, a treatment is conducted for at least partial removal of organic substances. This may be, for example, a thermal treatment at more than 200° C. or more than 400° C. It may also be a plasma treatment. The at least partial removal of the organic constituents reduces or removes any organic shell present around the nanowires. This facilitates the transfer of electrons between the nanowires. In this way, the conductivity of the structure obtained can be greatly improved. Preference is given to a plasma treatment.

Possible ways of obtaining plasma under vacuum conditions have been described frequently in the literature. The electrical energy can be bound by inductive or capacitative means. It may be direct current or alternating current; the frequency of the alternating current may range from a few kHz up to the MHz range. Energy supply in the microwave range (GHz) is also possible.

The primary plasma gases used may, for example, be He, argon, xenon, $N_2$, $O_2$, $H_2$, steam or air, and likewise mixtures of these compounds. Preference is given to a plasma composed of hydrogen and argon, for example 1% to 20% by volume of hydrogen in argon, especially $H_2$/Ar 5%/95%.

A plasma treatment can be conducted here at temperatures below 50° C., especially at room temperature. In this way, it is possible by the process of the invention to produce conductive structures without a step at temperatures exceeding 100° C., especially exceeding 60° C. It is also possible that the entire process is conducted at room temperature.

Nor are any intermediate steps needed for structuring, and it is also possible to dispense with any chemical further treatment.

It may be necessary to subject the surface of the substrate to a pretreatment. In a preferred development of the invention, the pretreatment comprises a plasma treatment, corona treatment, flame treatment and/or the applying and hardening of an organic-inorganic coating. A plasma treatment, corona treatment and/or flame treatment is an option especially in the case of film substrates, especially in the case of polymer films.

The invention also encompasses another embodiment of the process in which the process comprises the applying of the composition before or after the structuring to an inert surface.

This surface is preferably one comprising at least one fluorinated compound.

This may be, for example, a surface which has been coated with a composition comprising at least one hydrolyzable silane alone or in combination with further hydrolyzable silanes, where the hydrolyzable silane contains at least one nonhydrolyzable group comprising at least one fluorine atom. This may be, for example, a silane with a nonhydrolyzable group having at least one fluorine atom. Silanes of this kind are described, for example, in WO 92/21729 A1. Examples are hydrolyzable silanes of the general formula:

$$Rf(R)_b SiX_{(3-b)} \qquad (I)$$

where X is the same or different and is a hydrolyzable group and R is the same or different and is an alkyl substituent and b has the value of 0, 1 or 2.

Suitable examples of hydrolytically detachable X groups of the above formula are hydrogen, halogen (F, Cl, Br or I, especially Cl or Br), alkoxy (e.g. $C_{1-6}$-alkoxy, for example methoxy, ethoxy, n-propoxy, i-propoxy and n-, i-, sec- or tert-butoxy), aryloxy (preferably $C_{6-10}$-aryloxy, for example phenoxy), alkaryloxy, e.g. benzoyloxy, acyloxy (e.g. $C_{1-6}$-acyloxy, preferably $C_{1-4}$-acyloxy, for example acetoxy or propionyloxy) and alkylcarbonyl (e.g. $C_{2-7}$-alkylcarbonyl such as acetyl). Likewise suitable are $NH_2$, amino mono- or disubstituted by alkyl, aryl and/or aralkyl, examples of the alkyl, aryl and/or aralkyl radicals being as specified below for R, amido such as benzamido or aldoxime or ketoxime groups. Two or three X groups may also be joined to one another, for example in the case of Si-polyol complexes with glycol, glycerol or catechol. The groups mentioned may optionally contain substituents, such as halogen, hydroxyl, alkoxy, amino or epoxy. Preferred hydrolytically detachable X radicals are halogen, alkoxy groups and acyloxy groups. Particularly preferred hydrolytically detachable radicals are $C_{1-4}$-alkoxy groups, especially methoxy and ethoxy.

The hydrolytically nondetachable R radicals in the formula (I) are, for example, alkyl (e.g. $C_{1-20}$-alkyl, especially $C_{1-4}$-alkyl, such as methyl, ethyl, n-propyl, i-propyl, n-butyl, i-butyl, sec-butyl and tert-butyl), alkenyl (e.g. $C_{2-20}$-alkenyl, especially $C_{2-4}$-alkenyl, such as vinyl, 1-propenyl, 2-propenyl and butenyl), alkynyl (e.g. $C_{2-20}$-alkynyl, especially $C_{2-4}$-alkynyl, such as ethynyl or propargyl), aryl (especially $C_{6-10}$-aryl, such as phenyl and naphthyl) and corresponding aralkyl and alkaryl groups, such as tolyl and benzyl, and cyclic $C_{3-12}$-alkyl and -alkenyl groups, such as cyclopropyl, cyclopentyl and cyclohexyl.

The R radicals may have typical substituents, which may be functional groups via which crosslinking of the condensate via organic groups is also possible if required. Typical substituents are, for example, halogen (e.g. chlorine or fluorine), epoxide (e.g. glycidyl or glycidyloxy), hydroxyl, ether, ester, amino, monoalkylamino, dialkylamino, optionally substituted anilino, amide, carboxyl, alkenyl, alkynyl, acryloyl, acryloyloxy, methacryloyl, methacryloyloxy, mercapto, cyano, alkoxy, isocyanato, aldehyde, keto, alkylcarbonyl, acid anhydride and phosphoric acid. The substituents are bonded to the silicon atom via divalent bridging groups, especially alkylene, alkenylene or arylene bridging groups which may be interrupted by oxygen or —NH— groups. The bridging groups contain, for example, 1 to 18, preferably 1 to 8 and especially 1 to 6 carbon atoms. The divalent bridging groups mentioned derive, for example, from the abovementioned monovalent alkyl, alkenyl or aryl radicals. Of course, the R radical may also have more than one functional group.

Rf is a nonhydrolyzable group having 1 to 30 fluorine atoms bonded to carbon atoms, which are preferably separated from Si by at least 2 atoms, preferably an ethylene group. The Rf group preferably has 1 to 25, especially 3 to 18, fluorine atoms which are preferably bonded to aliphatic carbon atoms. Rf is preferably a fluorinated alkyl group having 3 to 20 carbon atoms. Examples of Rf are $CF_3CH_2CH_2$—, $C_2F_5CH_2CH_2$—, $n-C_6F_{13}CH_2CH_2$—, $i-C_3F_7OCH_2CH_2$—, $n-C_8F_{17}CH_2CH_2$— and $n-C_{10}F_{21}OCH_2CH_2$—.

Examples of suitable fluorinated silane compounds are $CF_3CH_2CH_2SiCl_2$ $(CH_3)$, $CF_3CH_2CH_2SiCl(CH_3)_2$, $CF_3CH_2CH_2Si(CH_3)$ $(OCH_3)_2$, $C_2F_5$—$CH_2CH_2$—$SiZ_3$, $n-C_6F_{13}$—$CH_2CH_2$—$SiZ_3$, $n-C_8F_{17}$—$CH_2CH_2$—$SiZ_3$, $n-C_{10}F_{21}$—$CH_2CH_2SiZ_3$ with (Z=$OCH_3$, $OC_2H_5$ or Cl), $i-C_3F_7O$—$CH_2CH_2CH_2$—$SiCl_2$ $(CH_3)$, $n-C_6F_{13}$—$CH_2CH_2$—$SiCl(OCH_2CH_3)_2$, $C_6F_{13}$—$CH_2CH_2$—$SiCl$ $(CH_3)_2$ and $n-C_6F_{13}$—$CH_2CH_2$—$SiCl_2$ $(CH_3)$.

The inert surface influences the wetting characteristics of the surface. If the composition comprising nanowires is then brought into contact with the surface, the result is aggregation of the nanowires with structure fidelity.

In this embodiment of the invention, the composition preferably comprises nanowires having a mean diameter below 50 nm, especially below 40 nm. Preference is given to a mean diameter above 0.5 nm, especially above 1 nm, preferably from 3 to 30 nm, especially from 5 to 20 nm, most preferably 15 nm. The length of the nanowires is above 1 μm, especially above 2 μm, preferably 3 μm to 200 μm, more preferably 4 to 130 μm.

The solvents used may be the same solvents as for the first embodiment of the invention.

The use of an inert surface changes the nature of the aggregation. The removal of the solvent in combination with the surface result in formation of interwoven structures composed of the nanowires along the structuring. Depending on the concentration of the nanowires used, it is possible to influence the height of the structures.

Especially nanowires having a mean diameter of 3 to 30 nm and a length of 4 μm to 130 μm have a lesser tendency to form parallel aggregates, and they instead result in formation of the woven structures probably because of the surface tension and the poor wettability of the inert surface by the composition.

The nanowires are arranged parallel to the surface only to a minor degree, and instead fill the interstitial space in the structure by means of a structure composed of woven nanowires. For this purpose too, a certain flexibility of the nanowires is required.

In order to enable the formation of the woven structure, it may be advantageous that the structuring generated has a minimum lateral extent of 0.2 μm.

In a preferred embodiment of the invention, the structuring comprises structures having a minimum lateral extent of less than 1 μm (measured by AFM and SEM). This means that the structures produced on the substrate have a minimum width of 20 μm, preference being given to a minimum extent of less than 10 μm especially less than 5 μm.

In a preferred embodiment, the structuring comprises lines or grids.

A particular advantage of the process of the invention is that the composition used can be applied to the substrates in a simple manner. The use of the nanowires enables the production of particularly fine, especially conductive structures in only a few steps. All known printing methods are used for this purpose, such as inkjet printing, intaglio printing, screen printing, offset printing or relief and flexographic printing. It is often the case that combination prints of the aforementioned printing methods are also used for the printing of the electrical functionalities. It may be necessary to match the printing plates or rollers or stamps used to the properties of the composition, for example by matching their surface energies.

There is actually no restriction in the structures obtained by structuring, provided that they can be produced by nanowires. For instance, it is possible with preference to apply structures consisting of branched or unbranched lines, such as conductor tracks or grids. Owing to the good resolution, it is possible by the process to apply conductive structures invisible to the eye. This plays a major role in the production of surfaces for touchscreens.

The structuring by the application of the structure template can even be integrated into standard printing methods, in that the structure template replaces the master.

The invention also relates to a coated substrate obtained by the process of the invention.

The invention also relates to a structured substrate comprising a structure composed of nanowires on the surface.

The structures are preferably metallic structures; they especially comprise the metals copper, silver, gold, nickel, zinc, aluminum, titanium, chromium, manganese, tungsten, platinum or palladium, preferably silver or gold.

In a particularly advantageous development of the invention, the coated substrate has metallic structures that are at least partly transparent. This can be achieved, for example, by the application of structures having a resolution below 20 μm to a transparent substrate, preferably below 10 μm. They may also be structures having a resolution below 5 μm or even 1 μm. "Resolution" means that the structure has structures having a minimum extent below the resolution mentioned. These are, for example, branched or unbranched lines having a width of the resolution mentioned, with a maximum distance of at least one line width between the lines, especially at least three times the line width.

The coated substrates which are obtained by the process of the invention can be used for many applications. Firstly, the process is suitable for applying reflective metal layers to surfaces. These can be used, for example, as reflective layers in holographic applications.

A particular advantage of the invention lies in the production of conductive structures. These are suitable as conductor tracks in electronic applications, in touchscreen displays, solar collectors, displays, as an RFID antenna or in transistors. They are therefore suitable as a substitute in products which have to date been produced on the basis of ITO (indium tin oxide), for example in TCO coatings (TCO: transparent conductive oxide).

The structures can alternatively be used in the field of transistors.

Further details and features will be apparent from the description of preferred working examples which follows in conjunction with the dependent claims. In this context, the respective features may be implemented alone or two or more may be implemented in combination with one another. The means of solving the problem are not restricted to the working examples. For example, stated ranges always include all the unspecified intermediate values and all conceivable part-intervals.

The working examples are shown schematically in the figures. Identical reference numerals in the individual figures denote elements that are identical or have the same function or correspond to one another in terms of their functions. The individual figures show:

DETAILED DESCRIPTION OF INVENTION

I. Structuring by Aggregation

Figure 1:
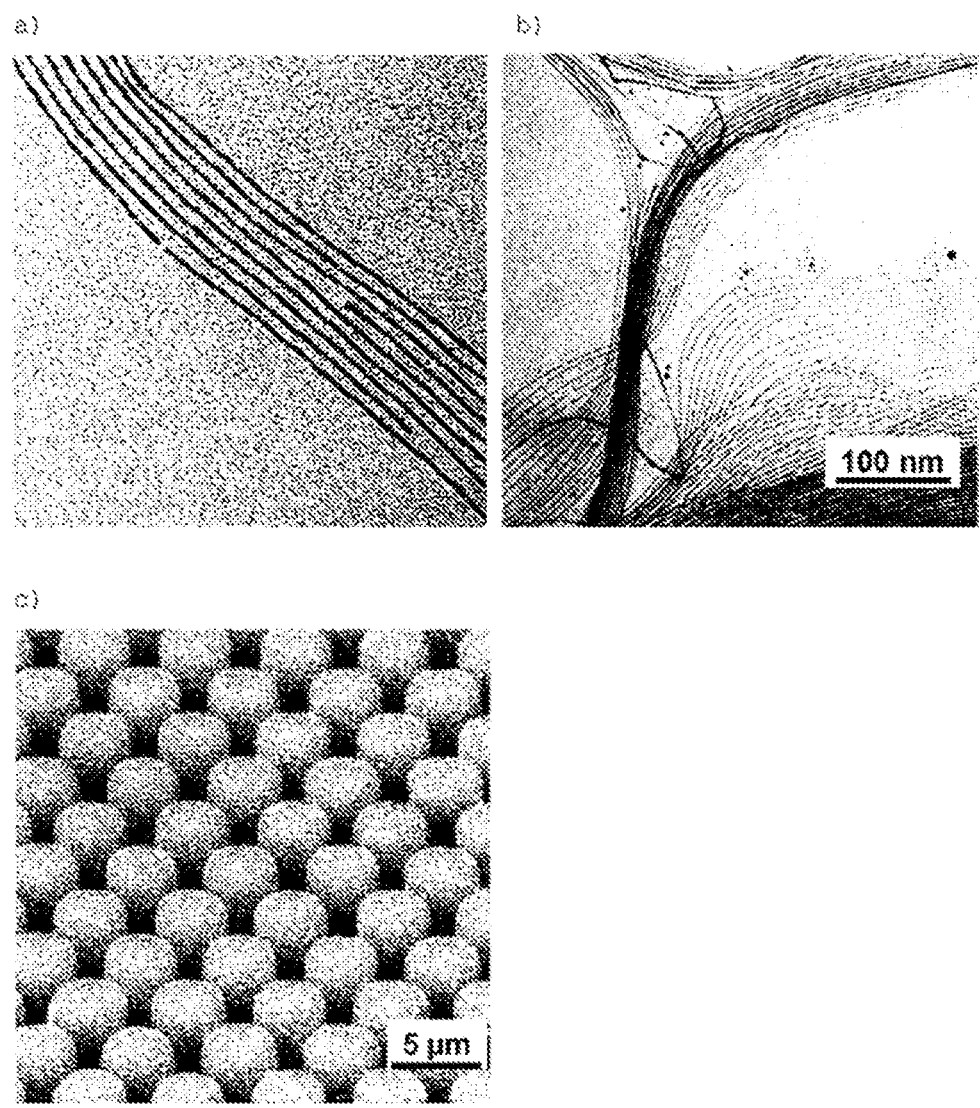
FIG. 1 a) TEM image of gold nanowires; b) TEM image of gold nanowires; c) SEM image of the stamp used.

FIG. 1 shows TEM images of gold nanowires. The nanowires, with a length below 2 nm, have a length of well above 500 nm. It is readily apparent in a) and b) how the nanowires combine to form bundles of their own accord. FIG. 1 c) shows one of the stamps used.

Figure 2:
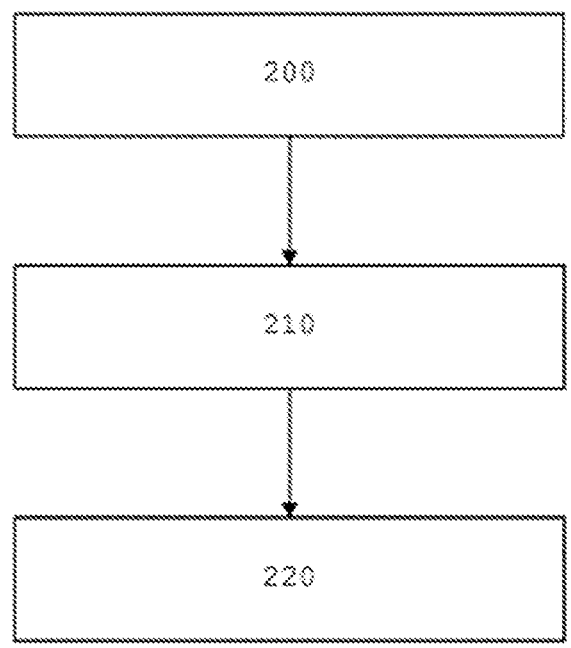
FIG. 2 schematic flow diagram of the process of the invention with nanowires.

FIG. 2 shows a schematic diagram of the sequence of a process of the invention. This firstly involves applying the composition to the surface (200). Thereafter, the nanowires in the composition are structured (210). This is preferably accomplished by applying a structure template with partial displacement of the composition. Thereafter, the solvent is at least partly removed (220).

Figure 3:
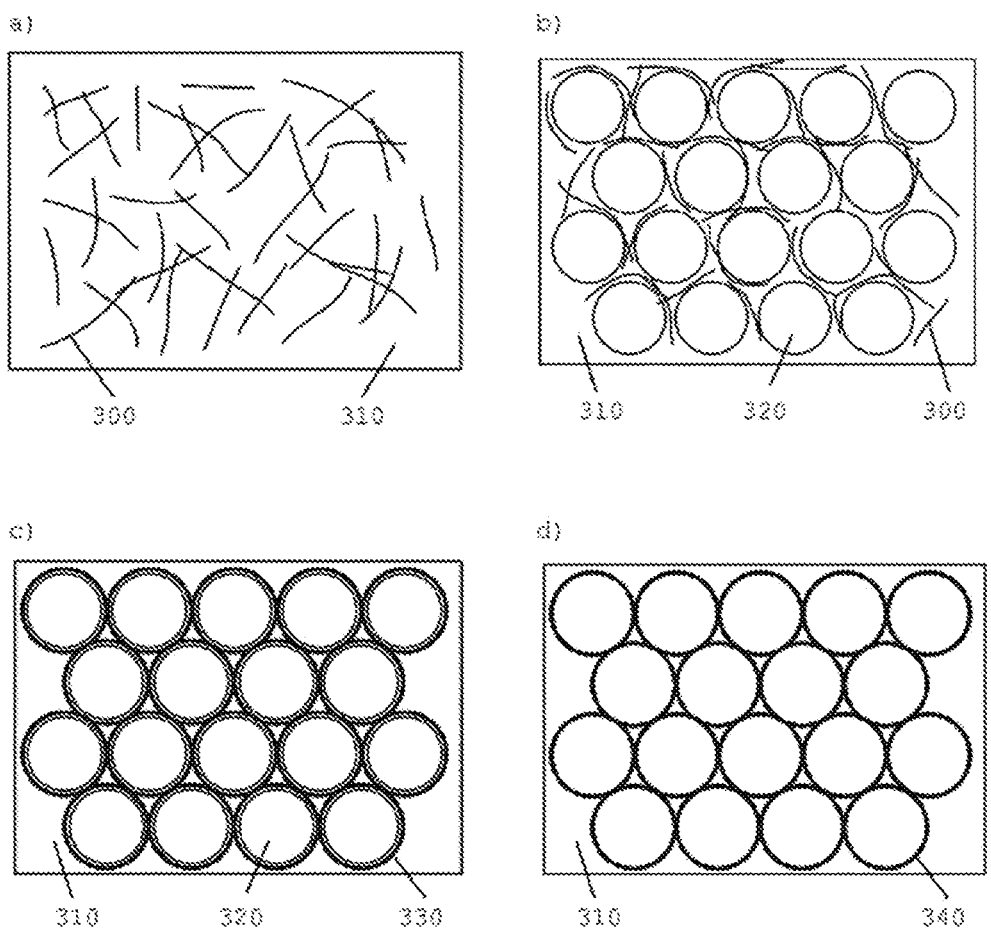
FIG. 3 schematic diagram of a sequence of the process of the invention with nanowires.

FIG. 3 shows an inventive embodiment of the process. As shown in FIG. 3 a), after the application of the composition, the nanowires 300 are arranged randomly on the surface of the substrate 310. They are still dispersed here in a solvent. Thereafter, a structure template, preferably in the form of a stamp 320, is applied to the surface 310 (FIG. 3 b)). In this case, the stamp comprises cylindrical projections with planar end faces (similarly to FIG. 1 c)). These form a contact face with the surface of the substrate 310. As a result, the composition is displaced in these regions. As a result, the nanowires are transferred into the interstices between the projections. Then the solvent is at least partly removed. This can be assured, for example, by virtue of the projections of the stamp being higher than the thickness of the composition applied. This results in formation of a cavity above the composition through which the solvent can evaporate. The local increase in the concentration of the nanowires results in formation of bundles of nanowires 330. These preferably aggregate between the projections 320 on the substrate 310 (FIG. 3 c)). After the structure template has been removed, what remains on the surface of the substrate 310 is a structure 340 formed from the nanowires (FIG. 3 d)). In some cases, it may be necessary to remove the organic constituents of the structure by an aftertreatment; this can be accomplished, for example, by a plasma treatment.

Figure 4:
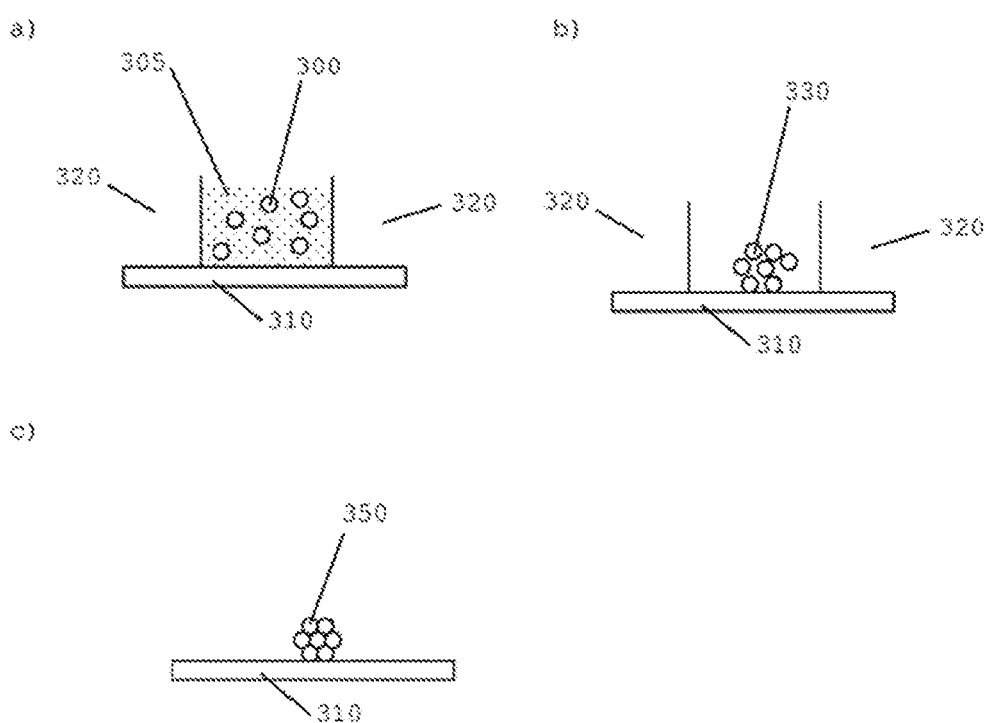
FIG. 4 schematic diagram of a sequence of the process of the invention with nanowires.

FIG. 4 shows the sequences of the process shown in FIG. 3 as a representation in vertical cross section. FIG. 4 a) shows the situation of FIG. 3 b) in vertical cross section. The composition applied is arranged between the two projections 320 that are in contact with the surface of the substrate 310. This composition in this case comprises a solvent 305 and the nanowires 300 dispersed therein, which are shown here as a round cross section. The representation does not mean that the nanowires are fully dispersed. It may quite possibly be the case that they are already in partly aggregated form in the dispersion and have thus already formed the first bundles. In the next step, the solvent 305 is removed. The nanowires 330 in the interstitial space between the projections 310 now combine to form bundles on the surface 310. This is also promoted by the fact that the nanowires are very long and flexible.

After the stamp has been removed, it is still possible to conduct a sintering step (FIG. 4c)). In this case, for example, a plasma treatment removes the organic shell of the nanowires and the density of the bundle of the nanowires is increased further. This can increase the conductivity of the nanowires bundles 350.

FIGS. 9, 10, 11, 12, 13 and 14 show further embodiments of the invention.

Figure 9:
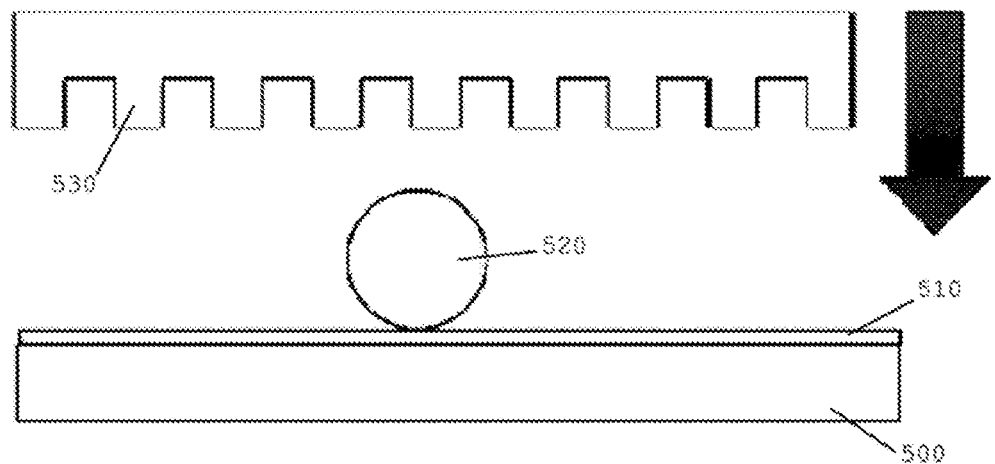
FIG. 9 schematic diagram of a process of the invention with an inert surface.
Figure 10:
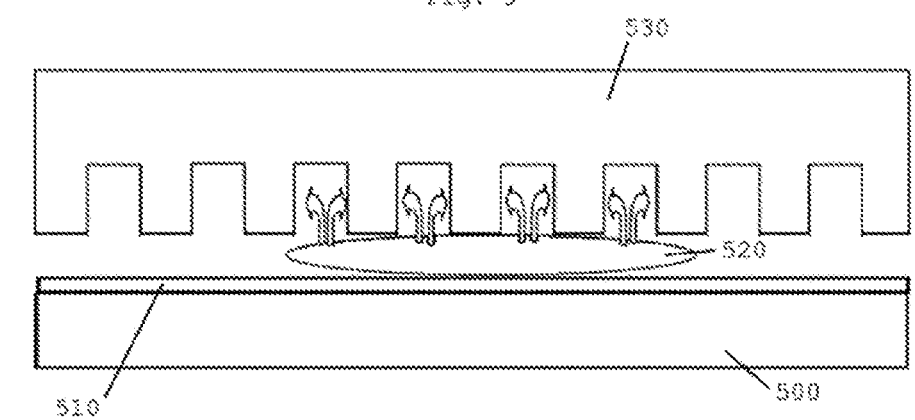
FIG. 10 schematic diagram of a process of the invention with an inert surface.
Figure 10:
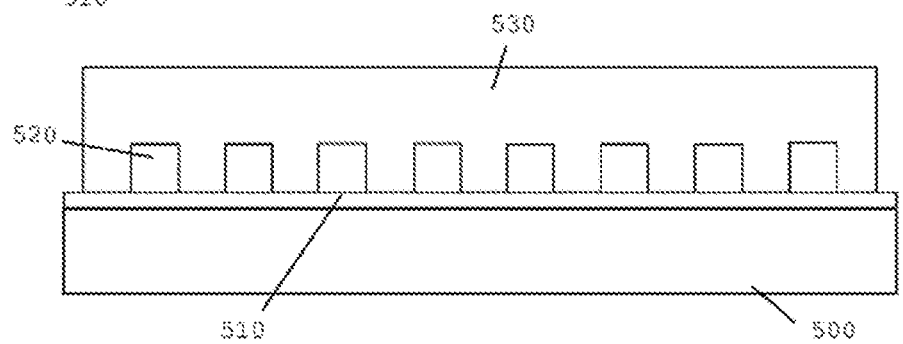

FIG. 9 shows a substrate 500, on the surface of which an inert layer 510 has been applied. The composition 520 comprising nanowires has been arranged thereon. A structure template in the form of a stamp 530 is applied to this surface. The operations here are shown in FIG. 10. The composition 520 is displaced by the projections of the structure template 530 into the interstices between the projections (upper part of the figure). This is promoted by the inert surface 510 on the substrate 500. When the projections of the structure template 530 have come into contact with the substrate 500, or with the inert surface 510, the entire composition 520 is arranged in the depressions of the structure template (FIG. 10, lower part of the figure).

Figure 11:
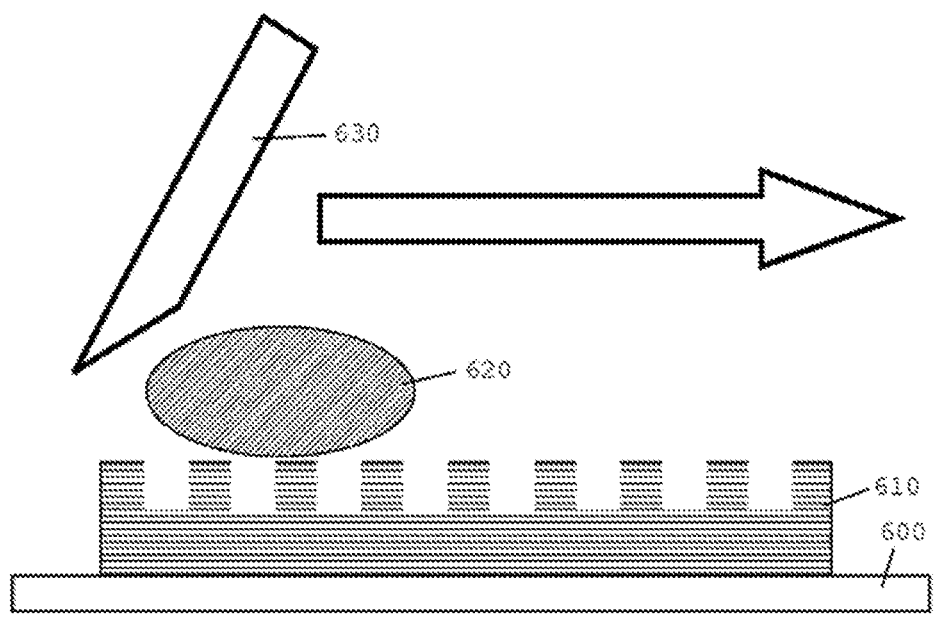
FIG. 11 schematic diagram of a further embodiment of a process of the invention with an inert surface.
Figure 12:
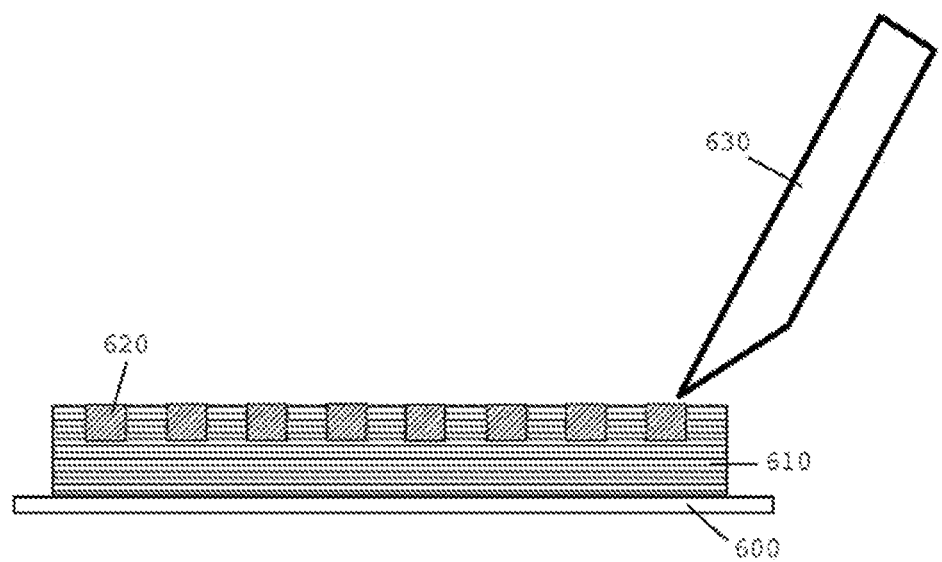
FIG. 12 schematic diagram of a further embodiment of a process of the invention with an inert surface.

FIGS. 11 to 14 show another embodiment of the invention. For this purpose, the composition comprising nanowires 620 is applied to a structure template 610 which may be arranged on a carrier 600 (FIG. 11). A coating bar 630 is used to force the composition into the depressions of the structure template. The "filled" structure template 610 obtained as a result, in which the depressions have been filled with composition 620, is shown in FIG. 12. The structure template may have been arranged on a carrier 600.

Figure 13:
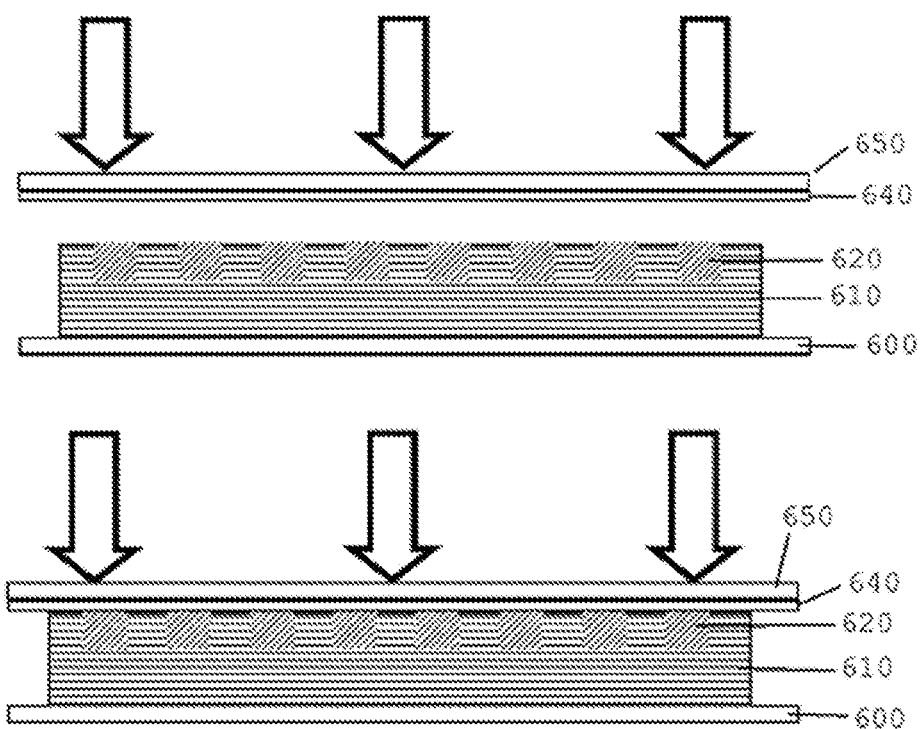
FIG. 13 schematic diagram of a further embodiment of a process of the invention with an inert surface.

As shown in FIG. 13, this filled structure template 610 with the composition 620 in the interstices can then be brought into contact with an inert surface 640 on a substrate 650 (lower part of the figure).

In order to produce the structure on the inert surface, the structure template together with the inert surface is rotated, such that the inert surface is arranged at the bottom. In this way, the nanowires can aggregate on the inert surface.

In principle, the same arrangement as shown in the lower part of FIG. 10 is obtained.

Irrespective of the manner of preparation of the arrangement, the solvent in the composition is now at least partly removed in this arrangement. In this way, the aggregation of the nanowires on the inert surface can be promoted.

Figure 14:
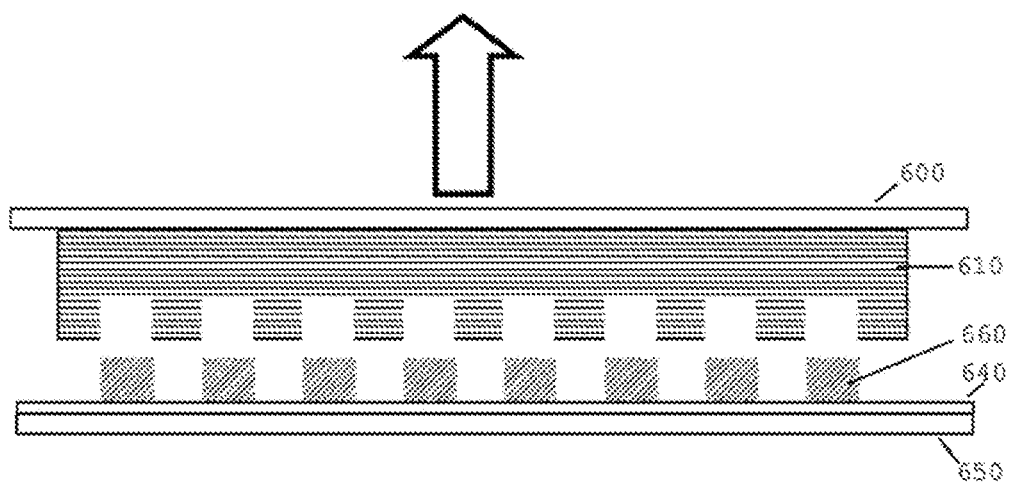
FIG. 14 schematic diagram of a further embodiment of a process of the invention with an inert surface.
Figure 15:
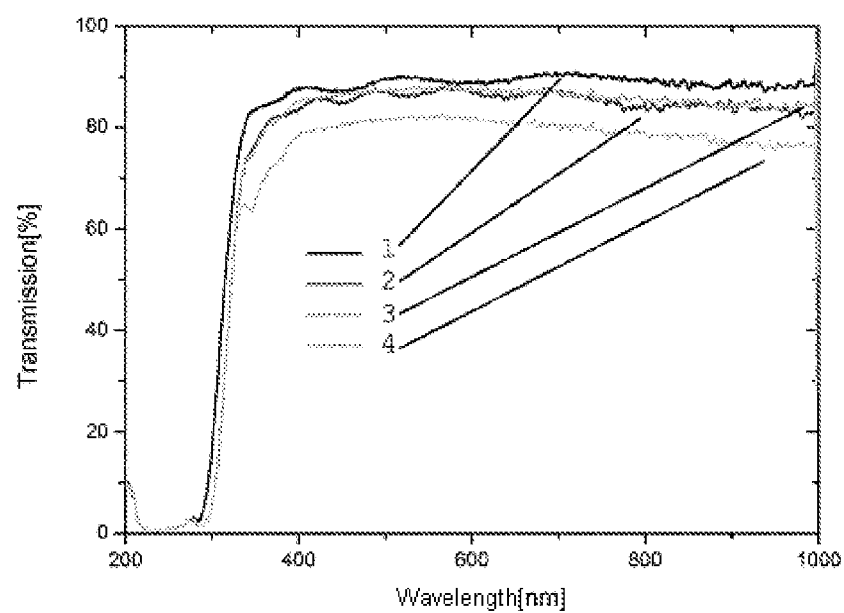
FIG. 15 measurement of the transmission of various samples (1: grid structure, variant 1; 2: grid structure, variant 2; 3: nanowires, flat; 4: nanowires, flat and densely packed)
Figure 16:
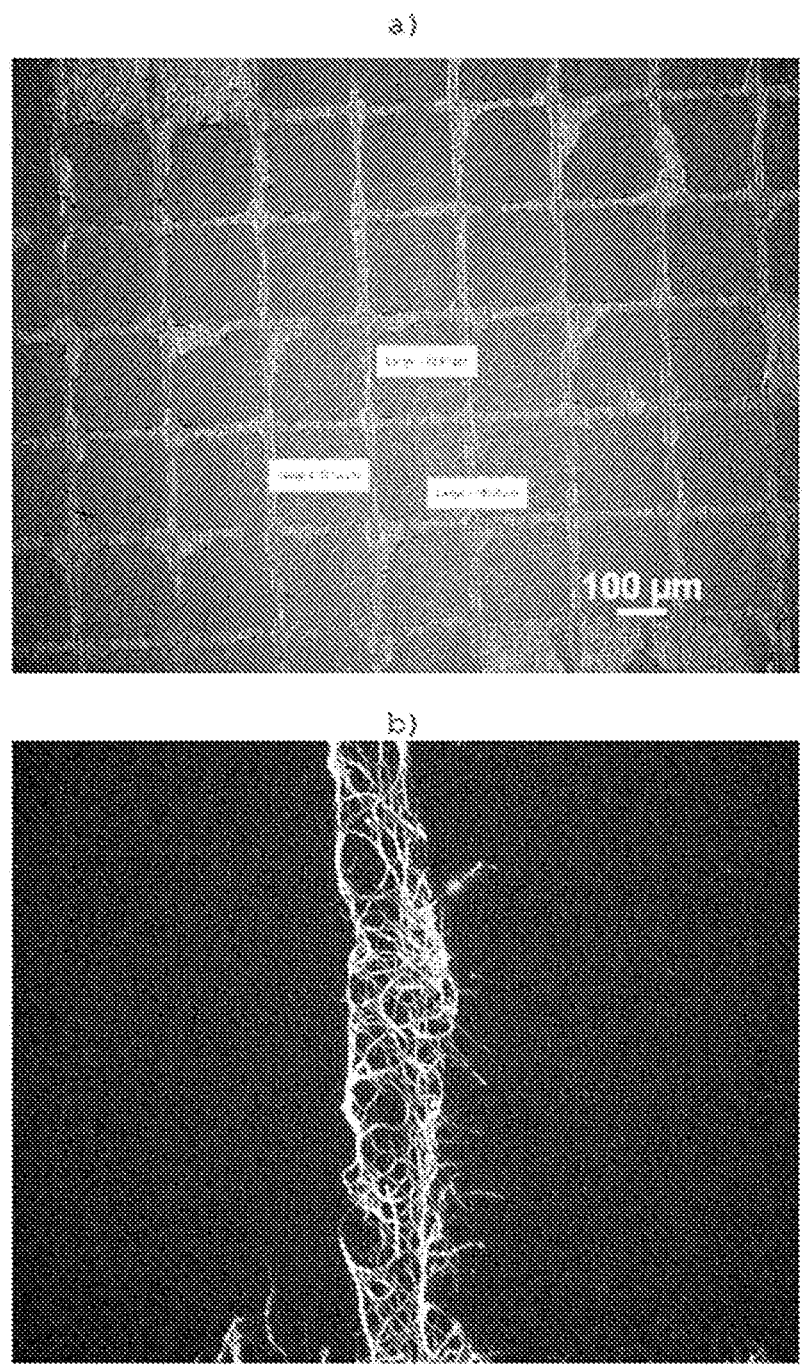
FIG. 16 SEM image of the grid structure obtained according to variant 1 (a) overall image; b) structure in greater resolution; structure width 18.68 µm+/−0.98 µm)
Figure 17:
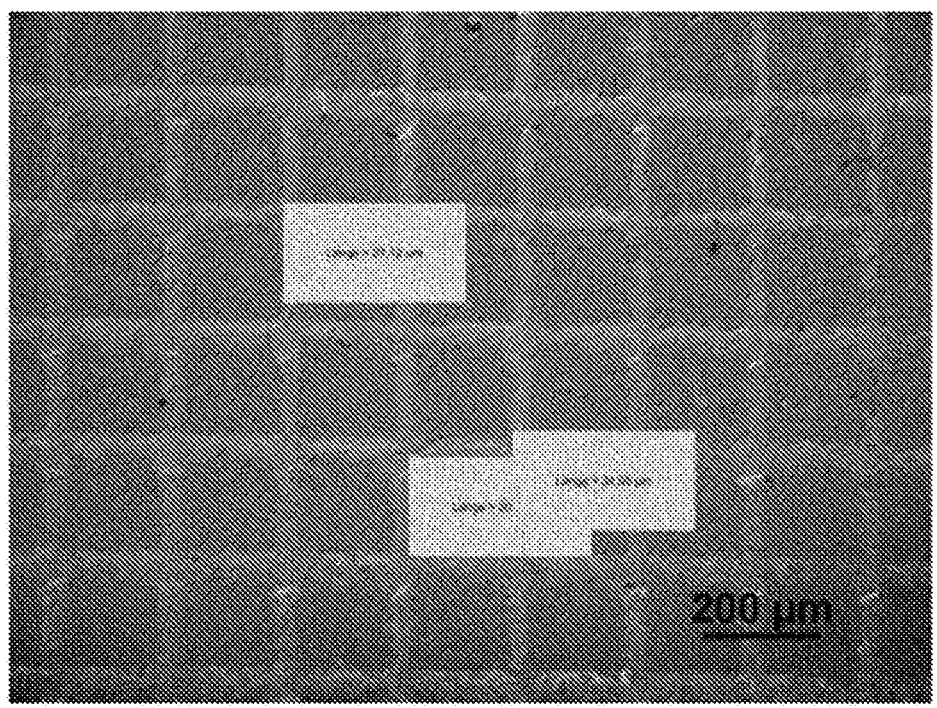
FIG. 17 SEM image of the grid structure obtained according to variant 2 (structure width 30.59 µm+/−3.8 µm)
Figure 18:
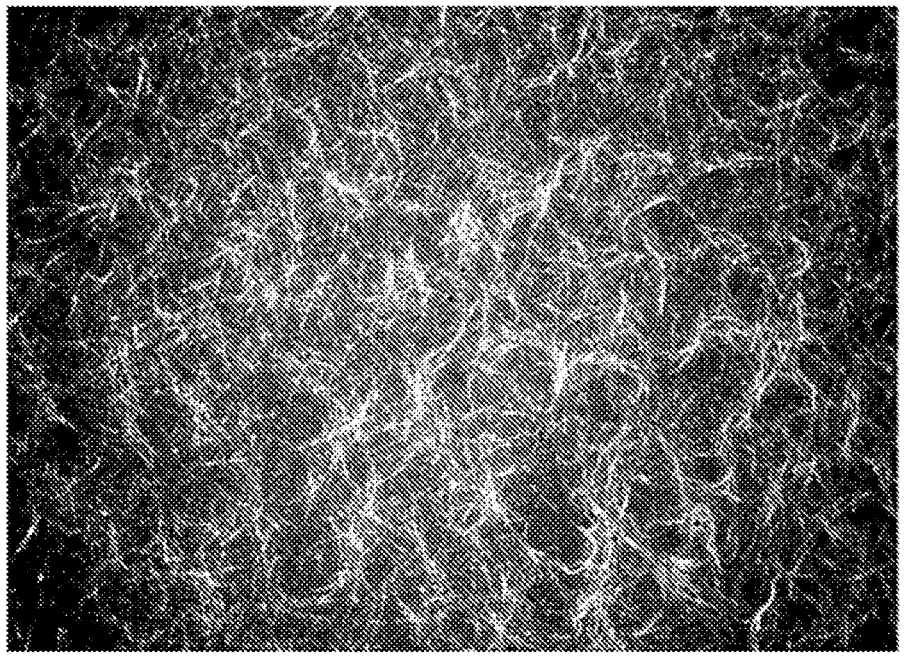
FIG. 18 SEM image of the silver nanowires, flat.
Figure 18:
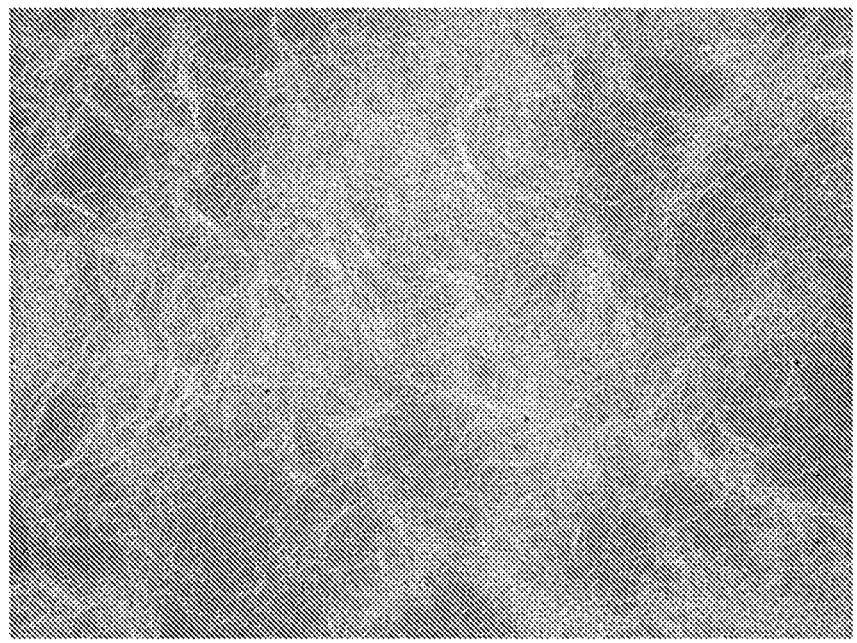

Thereafter, as shown in FIG. 14, the structure template 610 is removed. This affords a metallic structure 660 on the inert surface 640.

I.1. Examples

The TEM images were recorded with a JEM 2010 (JEOL, Germany) at 200 kV. The SEM images were recorded with a Quanta 400 ESEM (FEI, Germany). Optical measurements were recorded with a Cary 5000 (Varian). The spectrum of the glass substrate was recorded as the baseline. The current/voltage measurements were conducted with a Keithley 2450 Sourcemeter.

The gold nanowires were produced analogously to H. Feng, Y. Yang, Y. You, G. Li, J. Guo, T. Yu, Z. Shen, T. Wu, B. Xing, Chem. Commun. 2009, 1984 and J. H. M. Maurer, L. Gonzalez-Garcia, B. Reiser, I. Kanelidis, T. Kraus, ACS Appl. Mater. Interfaces 2015, 7, 7838.

For this purpose, 30 mg of $HAuCl_4 \times H_2O$ were dissolved in a mixture of 5.8 mL of n-hexane (99%, ABCR, Germany) and 1.7 mL of oleylamine ((Z)-octadec-9-enylamine technical grade, 70%, Sigma-Aldrich, Steinheim, Germany). 1.5 mL of triisopropylsilane (98%, ABCR, Germany) were added and the solution was left to stand at room temperature overnight. The nanowires were precipitated by the addition of ethanol. The supernatant was removed and the nanowires were redispersed in n-hexane. The wash step was repeated and the nanowires were then redispersed in cyclohexane, in order to obtain solutions having a gold concentration of 4 mg/mL or 8 mg/mL.

30 µL of a composition of gold nanowires dispersed in cyclohexane (4 mg/mL, 8 mg/mL) were applied to a substrate. Thereafter, a structured stamp made of PDMS was pressed immediately onto the substrate. The composition is forced into the depressions of the stamp as a result. The stamp comprised a hexagonal arrangement of cylindrical projections of diameter 4 µm and a distance between the projections of 5 µm (center to center). The height of the projections was 5 µm. When the solvent was evaporated, bundles of the gold nanowires which recreate the structure of the depressions were formed in the depressions. After the stamp had been removed, the structure was treated with a hydrogen plasma (mixture of 5% hydrogen in argon) at room temperature for 15 minutes (RF PICO plasma system (Diener electronic, Ebhausen, Germany) 0.3 mbar, 100 W).

Depending on the concentration of the gold nanowires in the composition, it was possible to control the thickness of the structures obtained. When a concentration of 4 mg/mL was used, a structure having an average thickness of 15 nm was obtained. The minimum width was 250 nm (FIG. 5 a)). When 8 mg/mL was used, it was possible to obtain a structure having an average thickness of 45 nm and a minimum width of 600 nm (FIG. 5 b)). The minimum width corresponds to the minimum width of the structure found in the SEM range.

Figure 5:
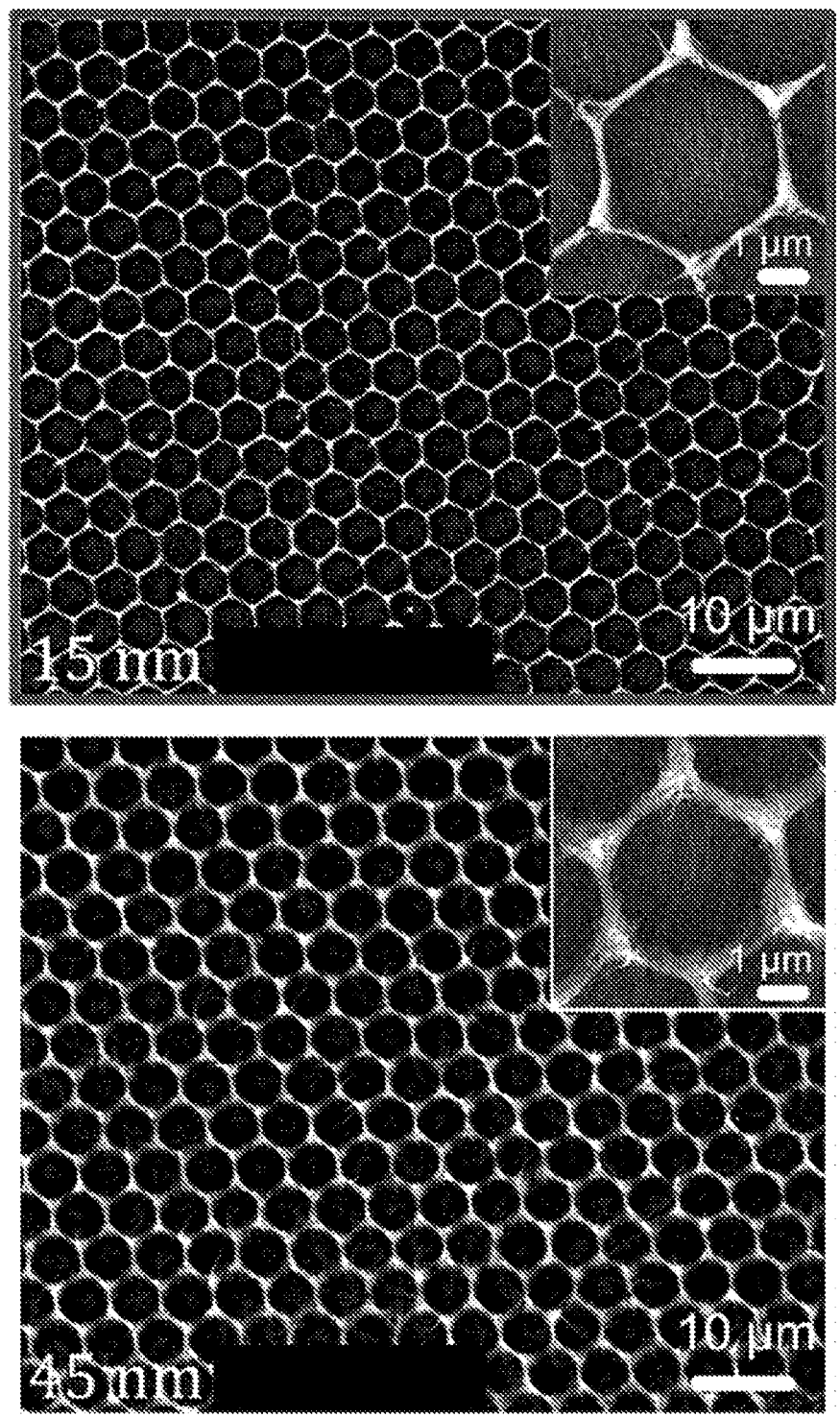
FIG. 5 SEM images of two structured coatings obtained; a) with an average thickness of 15 nm; b) with an average thickness of 45 nm; the small figures show an enlarged detail of the respective SEM image.
Figure 6:
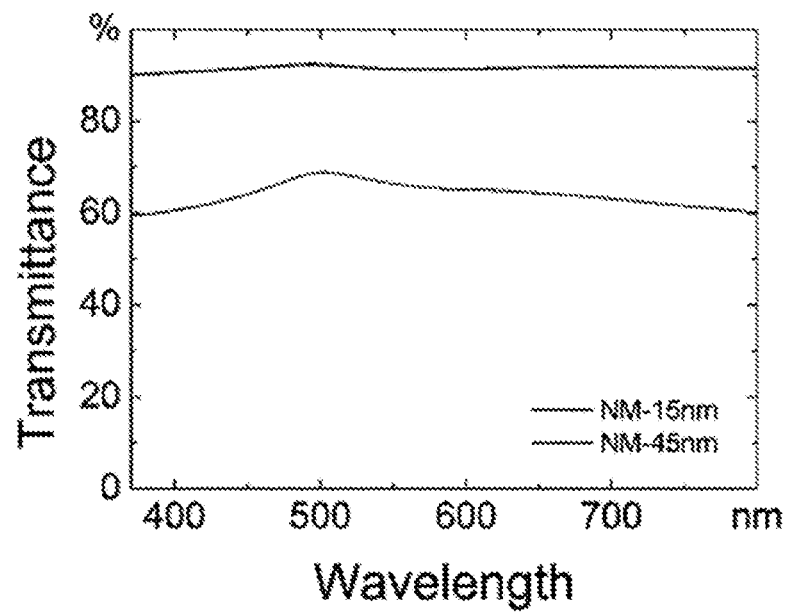
FIG. 6 a) transmission spectra of structured coatings obtained (NM-15 nm: structure from FIG. 4a; nm-45 nm: structure from 4b); b) conductivity measurements (NM-15 nm: structure from FIG. 4a; nm-45 nm: structure from 4b)
Figure 6:
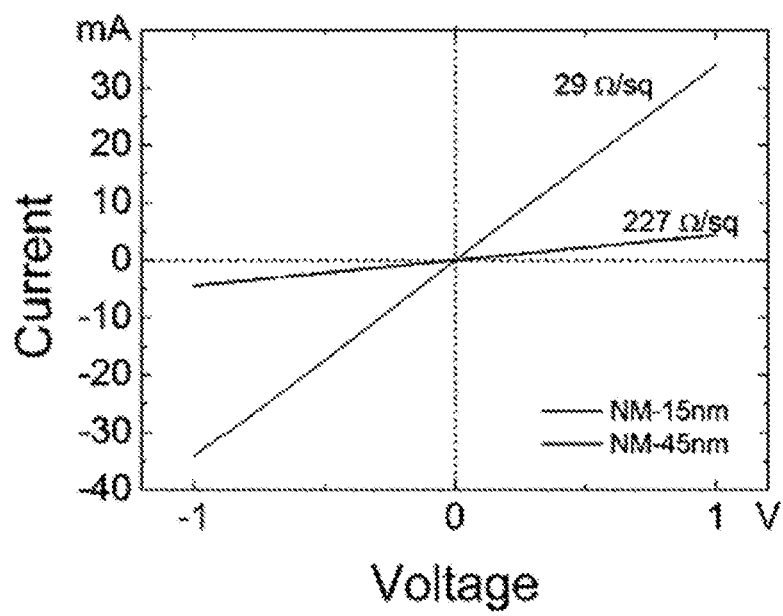

FIG. 6 a) shows transmission spectra of the grids obtained. The grid from FIG. 5 a) shows high transmission over the entire visible region (upper line). The grid from FIG. 5 b) also shows high transmission of up to 68% (lower line). The values are in good agreement with calculated values for a grid having the same coverage. The haze value measured was 1.6% (FIG. 5a) and 2.7% (FIG. 5b). This is below the value typically required for displays (<3%).

FIG. 6 b) shows the corresponding voltage/current diagrams. The thinner grid showed a resistance of 227 $\Omega$/sq, the thicker grid a resistance of 29 $\Omega$/sq. These are higher than the calculated values for grids of pure gold (32.5 $\Omega$/sq for d=5 µm, w=250 nm, h=15 nm, and 4.5 $\Omega$/sq for d=5 µm, w=600 nm, h=45 nm with a resistivity for gold of $2.44 \times 10^{-8}$ $\Omega$m). However, this can be attributed to irregularities in the grid, for example resulting from particle boundaries after sintering, and unconnected grid elements.

Figure 7:
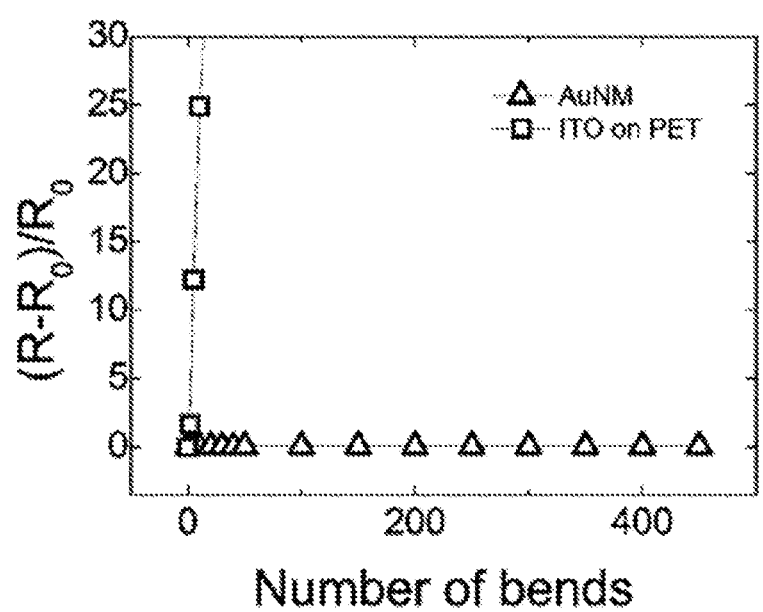
FIG. 7 measured change in the resistance of a grid of the invention (AuNM) and of a commercial grid of ITO (ITO on PET) on bending of the substrate.

FIG. 7 shows the results of bending tests. In the figure, the change in the resistance versus the initial resistance (($R-R_0$)/$R_0$) is plotted against the number of bending cycles. The samples were bent under tension with a bending radius of 5 mm. For the experiments, 10 inventive grids on PET were used with an initial average resistance of 100 $\Omega$/sq (AuNM). A comparative experiment used was a commercially available grid of ITO on PET having a resistance of 100 $\Omega$/sq (ITO on PET, Sigma-Aldrich, $R_0$=100 $\Omega$/sq). The resistance of the comparative sample rose by several orders of magnitude after a few cycles. For the grids of the invention, the rise within the first 50 cycles was below one order of magnitude, followed by an asymptotic trend toward ($R-R_0$) $R_0$=0.056 after 450 cycles. The grids of the invention are accordingly also suitable for flexible substrates.

Figure 8:
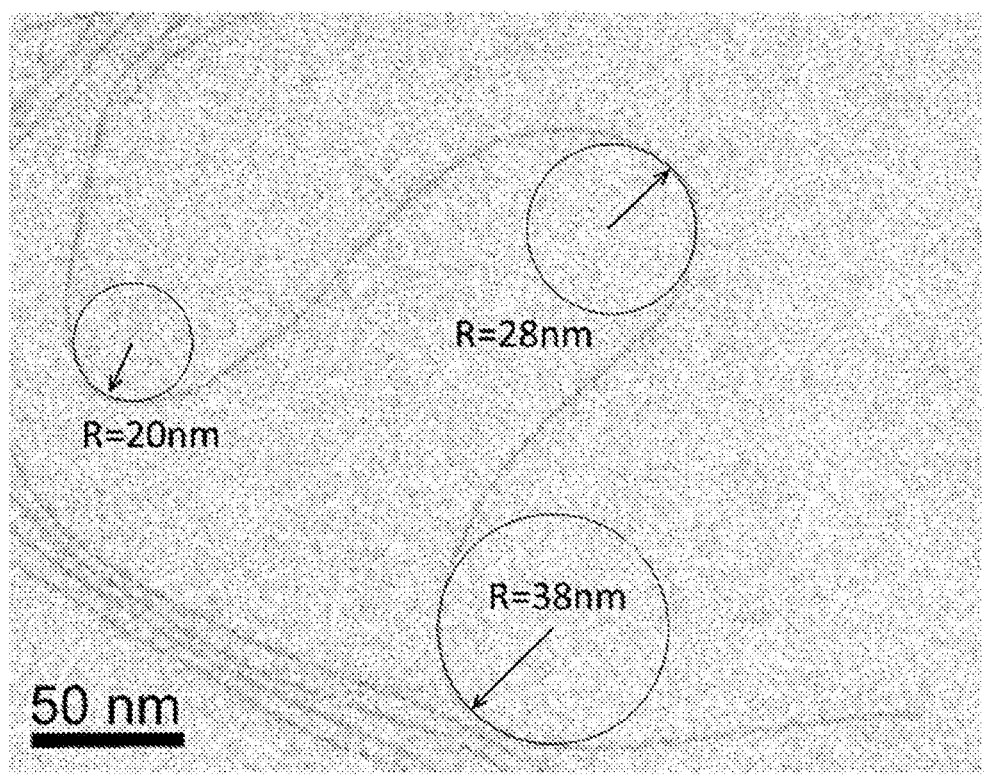
FIG. 8 TEM image of a bent gold nanowire.

FIG. 8 shows an example of the flexibility of the thin gold nanowires. The R values indicate the radii of the circles fitted to the bending. It was possible to observe bending radii of up to 20 nm without causing the wires to break.

I.2. Production of the Stamp

The PDMS stamp was produced with a silicone template. The prepolymer and the crosslinker of the PDMS kit (Sylgard 184, Dow Corning) were mixed in a ratio of 10:1 (by weight) and degassed. The mixture was introduced into the template which had been silanized beforehand with trichloro(octadecyl)silane (Sigma-Aldrich, St. Louis, Mo., USA), and hardened at 70° C. Thereafter, the stamp was removed from the template.

I.3. Comparative Examples

Compositions comprising commercially available silver nanowires (Seashell Technology; diameter 130 nm+/−10 nm; length 35 µm+/−15 µm) were produced and applied to surfaces analogously to the examples. It is found that there is no aggregation. Nor can the nanowires be displaced by applying a stamp, and so there is no formation of a structure.

Figure 19:
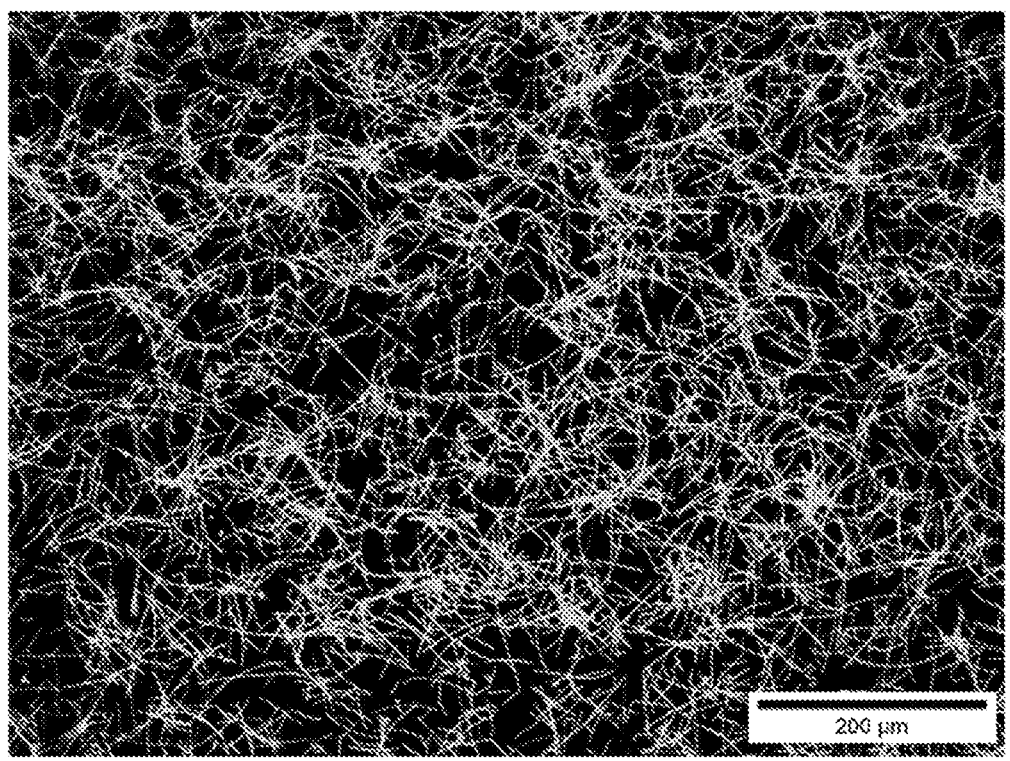
FIG. 19 SEM image of commercially available silver nanowires after structuring (comparative example)

FIG. 19 shows the analogous performance of the process of the invention with the same stamp. It is found that there is no structuring.

Figure 20:
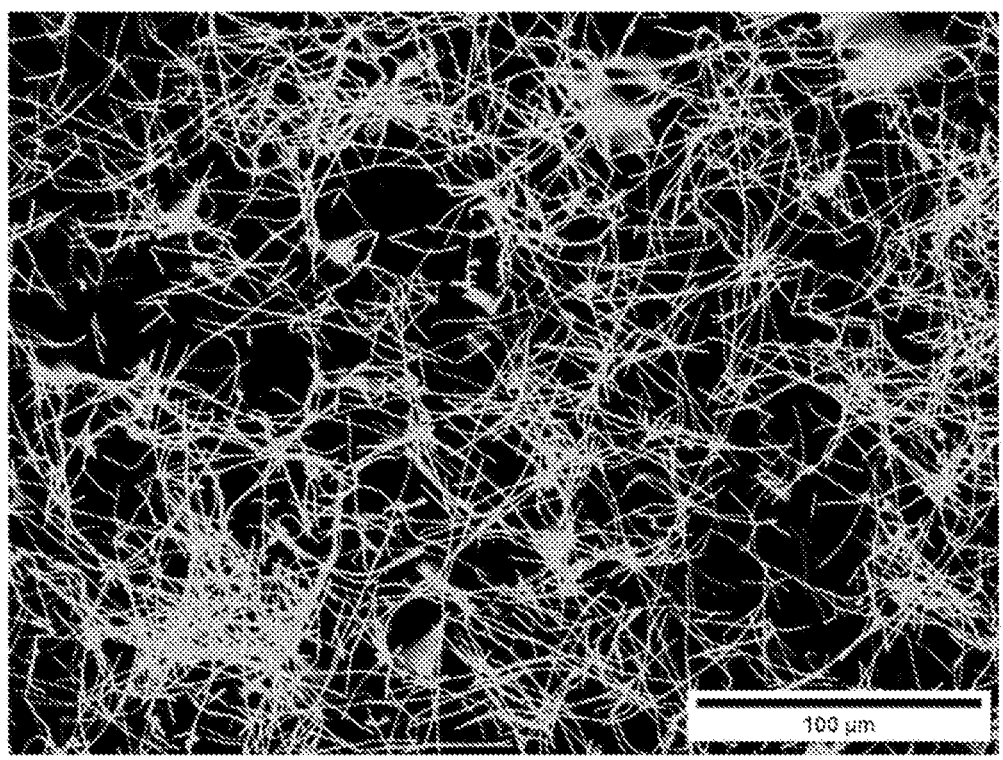
FIG. 20 SEM image of commercially available silver nanowires after structuring (comparative example).

Nor does a larger stamp (diameter 25 µm of the column-shaped projections with centers separated by 50 µm) lead to structuring (FIG. 20).

II. Structurizing with an Inert Surface

II.1. Production of a PDMS stamp

There follows a description of the production of an embossing stamp from PDMS (silicone rubber) as casting made from a nickel master:

II.1.A. Description of the Nickel Master and the Casting Mold

The nickel master is an electrolytically produced nickel foil, for example of dimensions 100 mm×100 mm, to which a microstructure (regularly arranged cylindrical columns having a diameter of more than 1 µm) has been applied. This nickel foil is adhesive-bonded to the base of a casting mold produced from aluminum or similar material or mounted by means of ferromagnetic bonding film. It should be noted here that the nickel master has to be applied in an absolutely planar manner since any unevenness will be reflected in the later stamp.

Moreover, the casting mold has to be placed in as horizontal a position as possible in order that the embossing stamp will later have a uniform thickness.

II.1.B. Mixing of the Silicone Rubber and Mold Casting

The base material and hardener of a polydimethyl-siloxane (PDMS) (e.g. Sylgard 184 from Dow Corning) are in a suitable ratio (e.g. 10:1) brought together and the two components are mixed by stirring. The amount to be made up is guided by the desired thickness of the embossing stamp (typical stamp thickness: 2 to 4 mm). The mixing vessel should have a capacity of 3 times the volume of the mixture in order to prevent overflow in the subsequent degassing operation.

For removal of the air bubbles mixed in in the course of stirring, the mixture is introduced into a vacuum drying cabinet (at room temperature) and evacuated until all the air bubbles have been removed.

The degassed PDMS mixture is then poured into the casting mold and the mixture is left to harden. In most cases, it is advisable to accelerate the hardening by heat treatment of the casting mold. Typically, heating of the casting mold to 70° C. for one hour leads to complete hardening of the PDMS.

II.1.C. Demolding Operation

The demolding of the PDMS stamp is accomplished by using a scalpel or another sharp blade to cut the PDMS away from the vertical wall of the casting mold around the entire circumference and then lifting it away from the edge with a flat and blunt tool (e.g. a flat spatula) and then cautiously detaching it from the nickel master. Irregularities at the edge can then be cut off with a sharp blade (e.g. carpet knife).

II.2. Functionalization of the substrate surface:

There follows a description of the production of the antiadhesive coating material (hydrophobic):

II.2.A. Varnish Production

Amounts Used:

| | |
|---|---|
| 267.8 g | methyltriethoxysilane (MTEOS) |
| 84.8 g | tetraethoxysilane (TEOS) |
| 150.0 g | Levasil 300/30 |
| 3.0 g | conc. (37%) hydrochloric acid |
| 13.35 g | perfluorooctyltriethoxysilane (Dynasylan F 8261) |
| 518.95 g | isopropanol |

Procedure:

A 2 L reactor (jacketed vessel with connected cooling) with an internal thermometer is charged with the amounts of MTEOS and TEOS weighed out. The amount of Levasil weighed out is added and the mixture is left to stir vigorously for 2-3 min. Then the amount of concentrated hydrochloric acid weighed out is added and the mixture is left to stir further. The reaction solution and the internal temperature on the thermometer are observed and the observation is written down. The temperature within the reactor should not exceed 60° C. in this time. After stirring for 10-15 min, the amount of perfluorooctyltriethoxysilane weighed out is added and the mixture is left to stir for a further 30 min. Then the amount of isopropanol weighed out is added and the mixture is left to stir for 15 min. The material is dispensed into a 2 L glass bottle and then filtered with the aid of a pressure filtration (prefilter+0.45 µm filter). The finished varnish is dispensed into a 2 L Schott glass bottle and stored in a refrigerator until further use.

II.2.B. Layer Production

The varnish was applied by means of spin-coating (1000 rpm/min, 30 sec) and baked in an oven (air atmosphere; heat up to 100° C. within 30 min; hold for 30 min, heat up to 250° C. within 240 min, hold for 1 h, cool down).

II.3. Silver Nanowire Solution

There follows a description of the preparation of a silver nanowire solution from Cambrios (solvent: ethylene glycol) for layer production:

II.3.A. Purification and Solvent Exchange Via Crossflow Filtration 200 mL of the silver nanowire solution in ethylene glycol are diluted with 200 mL of pure $H_2O$ (Millipore) and introduced into a large beaker. With the aid of a peristaltic pump (flow rate: 1.2 mL/sec), the solution is pumped through a filter cartridge (material: PES; pore size: 0.5 µm; from SpectrumLabs; model: Microkros 3×0.5 µm PES 1.0 mm mLL×FLL Dry (4/PK)). The filtrate removed is collected in a collecting vessel. The retentate is guided through a hose back into the large beaker. Filtration is continued until 200 mL of filtrate have been removed.

This process is conducted for a second time in order to remove as many disruptive silver particles as possible. Purity of the nanowire solution>90%.

II.3.B Determination of the Silver Content of the Purified Nanowire Solution in Water Before the weighing, the sample is agitated manually. The weighings are effected in 50 mL glass flasks, then 2 mL of $HNO_3$ (65%) are added to the samples and they are made up with ultrapure water. In order to avoid matrix effects, the standards are matched to the acid content of the samples. In order to verify reproducibility, 3 weighings are carried out in parallel.

Standards:

| Element | S0 | S1 | S2 |
|---|---|---|---|
| Ag (mg/L) | 0.0 | 5.0 | 8.0 |

Instrument Parameters:
 ICP OES, Horiba Jobin Yvon Ultima 2
 Ag determination: clinical nebulizer: pressure: 2.00 bar, flow rate: 0.781/min
 Ag: $\lambda$=328.068 nm The determination gave a silver content of 0.295% by weight+/−0.002.

II.3.C. Further Solvent Exchange to Obtain a Coating Solution with Different Leveling Properties than the Water-Based Silver Nanowire Solution 5 mL of the purified silver nanowire solution in water are mixed with 2 mL of 1-amino-2-butanol, 5 µL of TODS (3,6,9-trioxadecanoic acid) and 10 mL of acetone, and centrifuged (speed: rcf=2000; duration: 1 min). The resultant supernatant is decanted off and the sediment formed is redispersed in 10 mL of 1-amino-2-butanol.

II.4. Nanoimprint 1

There follows a description of the production (variant 1) of a grid structure of silver nanowires with the aid of a PDMS stamp, in which the silver nanowires are arranged in gridlines:

II.4.A. Description of the Preparation of the Silver Nanowire Solution Shortly Before Sample Production The sample vessel with the nanowire solution present therein is agitated briefly before the sample production with the aid of a vortexer (from Heidolph, model: Reax control, speed: 2500 rpm), in order to redisperse the sediment.

II.4.B. Coating Operation

A glass substrate (size: 10 cm×10 cm×0.11 cm), coated with the antiadhesive coating material (see point 11.2), is placed flat on a laboratory bench. A droplet (volume: 20 µL) of the nanowire solution prepared is applied in the middle.

A structured PDMS stamp (production described in point 1) is pressed on manually such that the solution is distributed homogeneously under the stamp and excess material is displaced.

In order to evaporate off the excess solvent, the sample (substrate+stamp) is placed onto a hotplate and heated to 50° C. During this process, a metal plate (weight: 800 g) is placed onto the PDMS stamp in order to assure optimal, uniform adhesion of the stamp on the substrate. After 15 min, the sample assembly (substrate→stamp→metal plate) is removed from the hotplate and left to cool on the laboratory bench.

As soon as the sample has cooled down, the metal plate is first removed, one hand is used to stabilize the substrate on the benchtop and the other is used to remove the PDMS stamp by pulling it off.

II.4.C. Coating Operation, Variant 2

A PDMS stamp with grid structure (production described in point 1, line width 15 µm) is placed by its reverse side (unstructured) onto an uncoated glass substrate (size: 5 cm×5 cm×0.11 cm). A droplet (volume: 20 µL) of the nanowire solution prepared is applied to the structured side of the PDMS stamp at the edge.

With the aid of a kind of coating bar (a razor blade here), the droplet of nanowire solution is distributed homogeneously over the structured surface of the PDMS stamp.

Subsequently, a coated glass substrate (size: 5 cm×5 cm×0.11 cm, coated with antiadhesive coating material) is pressed manually onto the coated side of the PDMS stamp covered with nanowires.

The sample assembly (uncoated glass substrate→PDMS stamp→coated glass substrate) is turned over and dried at 50° C. on a hotplate, weighted down with a metal plate (weight: 800 g). After 1 h, the sample assembly is removed from the hotplate and left to cool on the laboratory bench. As soon as the sample has cooled down, the metal plate is first removed, one hand is used to stabilize the coated substrate and the other is used to remove the PDMS stamp and the uncoated glass substrate by pulling them off.

II.4.D. Characterization

1. Measurement of Transmission:
 Transmission was determined with the aid of a spectrometer (instrument: Ocean Optics QEPro, lamp: DH-2000-BAL).

2. Determination of Conductivity:
 Conductivity was determined with the aid of a 2-point meter (from Keithley, instrument: 2000 Multimeter) on a respective area of 5 mm×5 mm, on which contacts were made with conductive silver varnish on two opposite sides.

II.5. Nanoimprint 2

There follows a description of the production (variant 2) of a grid structure from silver nanowires with the aid of a PDMS stamp, in which the silver nanowires are arranged in the square grid areas and these areas are each separated from one another by lines arranged in the form of a grid:

II.5.A. Pretreatment of the Antiadhesively Coated Substrate

A PDMS stamp with grid structure (production described in point 1) is placed onto a glass substrate (size: 10 cm×10 cm×0.11 cm), coated with the antiadhesive coating material (see point 2). Then the substrate including the stamp placed on is subjected to a plasma treatment in a plasma chamber (duration: 30 min, gas: oxygen). The PDMS stamp is merely placed on and not pressed on, in order thus to hydrophilize the square surfaces of the grid structure of the stamp. And even the actually hydrophobic, coated substrate is hydrophilic after the plasma treatment.

II.5.B. Description of the Preparation of the Silver Nanowires Solution Shortly Before Sample Production The sample vessel with the nanowire solution present therein is agitated shortly before the sample production with the aid of a vortexer (from Heidolph, model: Reax control, speed: 2500 rpm), in order to redisperse the sediment.

II.5.C. Coating Operation

The hydrophilized substrate is placed flat on to a laboratory bench. A droplet (volume: 20 µL) of the nanowire solution prepared is applied in the middle and the hydrophilized PDMS stamp is pressed on manually such that the solution is distributed uniformly under the stamp and excess material is displaced. In order to evaporate the excess solvent, the sample (substrate+stamp) is placed onto a hotplate and heated to 50° C. During this process, a metal plate (weight: 800 g) is placed onto the PDMS stamp. After 15 min, the sample assembly (substrate→stamp→metal plate) is removed from the hotplate and left to cool on the laboratory bench. As soon as the sample has cooled down, the metal plate is first removed, one hand is used to stabilize the substrate on the benchtop and the other is used to remove the PDMS stamp by pulling it off.

LITERATURE CITED

H. Feng, Y. Yang, Y. You, G. Li, J. Guo, T. Yu, Z. Shen, T. Wu, B. Xing, Chem. Commun. 2009, 1984.
J. H. M. Maurer, L. González-Garcia, B. Reiser, I. Kanelidis, T. Kraus, ACS Appl. Mater. Interfaces 2015, 7, 7838.

The invention claimed is:

1. A process for producing metallic structures, comprising:
   (a) providing a composition comprising metallic nanowires and at least one solvent;
   (b) structuring the composition on a surface of a substrate by contacting a structure template with a surface of the substrate before or after applying the composition to the surface; and
   (c) at least partly removing the at least one solvent while the structure template is contacted with the surface of the substrate, thereby resulting in aggregation of the metallic nanowires on the surface of the substrate and forming metallic structures on the surface of the substrate,
   wherein the metallic nanowires form bundles parallel to the surface of the substrate following recesses of the structure template in a longitudinal direction.

2. The process as claimed in claim 1, comprising applying the composition to a substrate and subsequently applying the structure template to the substrate with partial displacement of the composition.

3. The process as claimed in claim 1, wherein the applying and the structuring are effected by applying the composition into a structured mask.

4. The process as claimed in claim 1, wherein at least 50% by weight of the metallic nanowires have a length exceeding 1 µm.

5. The process as claimed in claim 1, wherein at least 50% of the metallic nanowires have an aspect ratio of length to diameter of at least 500:1.

6. The process as claimed in claim 1, wherein the metallic nanowires have a mean diameter below 15 nm.

7. The process as claimed in claim 1, wherein the metallic nanowires have a mean diameter below 5 nm.

8. The process as claimed in claim 1, further comprising subjecting the structures obtained to thermal treatment or plasma treatment.

9. The process as claimed in claim 1, wherein the substrate has a surface comprising at least one hydrolysable silane having at least one nonhydrolyzable group comprising at least one fluorine atom.

10. The process as claimed in claim 9, wherein the metallic nanowires have a mean diameter below 100 nm.

11. The process as claimed in claim 1, wherein the metallic nanowires aggregate to form bundles on the substrate between projections that are formed by the structure template.

12. The process as claimed in claim 1, wherein the metallic structures are in the form of a grid.

13. A process for producing metallic structures, comprising:
   contacting a structure template having projections with a surface of a substrate and with a composition comprising metallic nanowires and at least one solvent on the surface of the substrate;
   at least partly removing the at least one solvent while the structure template is in contact with the surface of the substrate; and
   aggregating the metallic nanowires on the surface of the substrate between the projections of the structure template thereby forming metallic structures comprising bundles parallel to the surface of the substrate following recesses of the structure template in a longitudinal direction.

* * * * *